United States Patent
Lee

(10) Patent No.: US 9,779,918 B2
(45) Date of Patent: Oct. 3, 2017

(54) SUBSTRATE TREATING APPARATUS AND METHOD

(71) Applicant: PSK INC., Hwaseong-si, Gyeonggi-do (KR)

(72) Inventor: Chang Weon Lee, Hwaseong-si (KR)

(73) Assignee: PSK INC., Gyeonggi-do (KR)

( * ) Notice: Subject to any disclaimer, the term of this patent is extended or adjusted under 35 U.S.C. 154(b) by 0 days.

(21) Appl. No.: 14/542,891

(22) Filed: Nov. 17, 2014

(65) Prior Publication Data
US 2015/0187545 A1    Jul. 2, 2015

(30) Foreign Application Priority Data

Dec. 26, 2013 (KR) .................. 10-2013-0164428

(51) Int. Cl.
| | |
|---|---|
| C23C 16/00 | (2006.01) |
| C23C 16/50 | (2006.01) |
| C23F 1/00 | (2006.01) |
| H01L 21/306 | (2006.01) |
| H01J 37/32 | (2006.01) |
| C23C 16/44 | (2006.01) |
| C23C 16/458 | (2006.01) |

(52) U.S. Cl.
CPC .... H01J 37/32834 (2013.01); C23C 16/4412 (2013.01); C23C 16/4585 (2013.01); H01J 37/32091 (2013.01)

(58) Field of Classification Search
USPC .................. 118/715–733; 156/345.1–345.55
See application file for complete search history.

(56) References Cited

U.S. PATENT DOCUMENTS 6,261,408 B1 * 7/2001 Schneider ........... C23C 16/4412
  118/715
6,531,069 B1 * 3/2003 Srivastava ........ H01J 37/32623
  118/723 R

FOREIGN PATENT DOCUMENTS

| KR | 1020090024520 B | 3/2009 |
|---|---|---|
| KR | 1020100077887 B | 7/2010 |

\* cited by examiner

*Primary Examiner* — Karla Moore
*Assistant Examiner* — Tiffany Nuckols
(74) *Attorney, Agent, or Firm* — Procopio, Cory, Hargreaves & Savitch LLP

(57) ABSTRACT

Provided is a substrate processing apparatus. The substrate treating apparatus includes a processing chamber, a substrate supporting unit, a plasma generation unit, a gas supplying unit, an exhaust adjusting unit, or the like. Residual gas and reaction by-products are generated in a chamber after a substrate is treated by using a gas supplied from the gas supplying unit or plasma excited by the plasma generation unit. The gas exhaust adjusting unit adjusts discharge amounts of residual gas and reaction by-products to adjust residence time or pressure of gas, plasma, or the like in the apparatus, thereby controlling a uniformity of the substrate treating process.

12 Claims, 8 Drawing Sheets

SUBSTRATE TREATING APPARATUS AND METHOD

CROSS-REFERENCE TO RELATED APPLICATIONS

This U.S. non-provisional patent application claims priority under 35 U.S.C. §119 of Korean Patent Application No. 10-2013-0164428, filed on Dec. 26, 2013, the entire contents of which are hereby incorporated by reference.

BACKGROUND OF THE INVENTION

The present invention disclosed herein relates to a substrate treating apparatus and method, and more particularly, to a substrate treating apparatus which treats a substrate using gas or plasma, and a gas discharging method.

Manufacturing a semiconductor device requires various processes such as deposition, photolithography, etching, ashing, cleaning, and polishing. In a process such as deposition, etching, and ashing, the flow and residence time of gas or plasma have an effect on the uniformity of a substrate treating process while a semiconductor substrate is treated in a chamber using gas or plasma FIG. 1 is a cross-sectional view of a typical substrate treating apparatus which treats a substrate using gas. Referring to FIG. 1, the flow and residence time of gas or plasma are adjusted by the gas supplying amount of a gas supplying unit 8 or the level of vacuum pressure of a vacuum pump 9, but it is not easy to control the uniformity of a substrate treating process only using the gas supplying amount and the level of vacuum pressure.

SUMMARY OF THE INVENTION

The present invention provides a substrate processing apparatus capable of controlling a uniformity of a substrate treating process by directly adjusting discharge amounts of residual gas and reaction by-products during a substrate processing process.

The object of the present invention is not limited to the aforesaid, but other objects not described herein will be clearly understood by those skilled in the art from descriptions below.

Embodiments of the present invention provide substrate treating apparatuses including: a processing chamber having an inner space for treating a substrate and having an opening through which residual gas and reaction by-products are discharged; a substrate supporting unit disposed in the processing chamber to support a substrate; a plasma generation unit generating plasma supplied to the substrate; and an exhaust adjusting unit adjusting discharge amounts of residual gas and reaction byproducts in the chamber, wherein the exhaust adjusting unit includes: an exhaust container surrounding a side surface of the substrate supporting unit, and having an exhaust hole; an adjusting member adjusting an opening/closing rate of the exhaust hole; and a driving unit allowing the adjusting member to vertically move.

In some embodiments, the exhaust hole may include inner side holes provided on an inner surface of the exhaust container, and the adjusting member may be provided between the substrate supporting unit and the exhaust container.

In other embodiments, the exhaust hole may include inner side holes provided in an inner surface of the exhaust container or upper side holes provided on a top surface of the exhaust container, and the adjusting member may be provided in the exhaust container.

In other embodiments of the present invention, substrate treating methods using the substrate treating apparatus include adjusting an opening/closing rate of the exhaust holes by adjusting a height of the adjusting member while a process is performed on the substrate inside the chamber.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Hereinafter, preferred embodiments of the present invention will be described below in more detail with reference to the accompanying drawings. The embodiments of the present invention may, however, be embodied in different forms and should not be construed as limited to the embodiments set forth herein. These embodiments are provided so that this disclosure will be thorough and complete, and will fully convey the concept of the present invention to those skilled in the art. Therefore, shapes of the elements illustrated in the figures are exaggerated for clarity.

A substrate 10 in an exemplary embodiment of the present invention may be a semiconductor wafer, but is not limited thereto. Thus, the substrate 10 may be a different type of substrate such as a glass substrate.

Hereinafter, a substrate treating apparatus 1 according to an embodiment of the present invention will be described.

Figure 1:
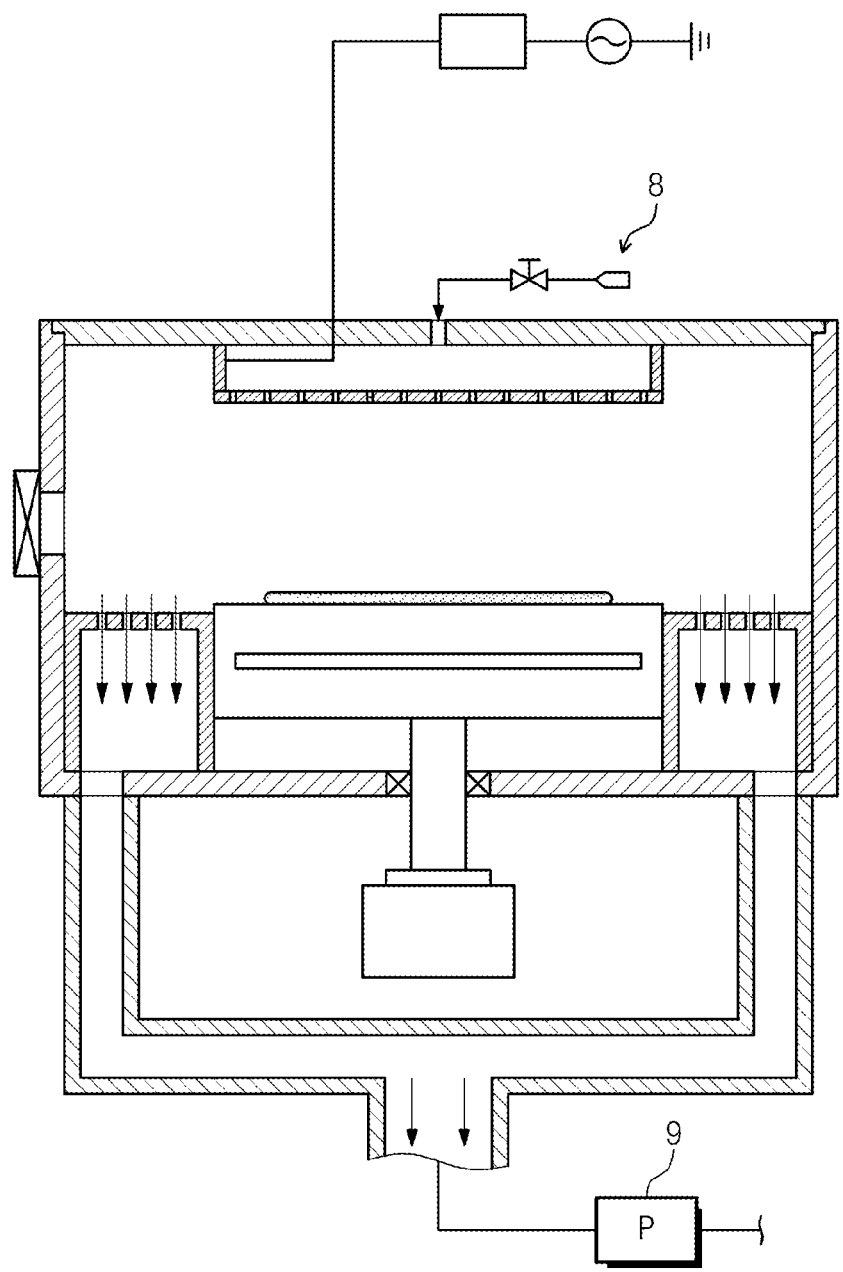
FIG. 1 is a cross-sectional view of a typical substrate treating apparatus.
Figure 2:
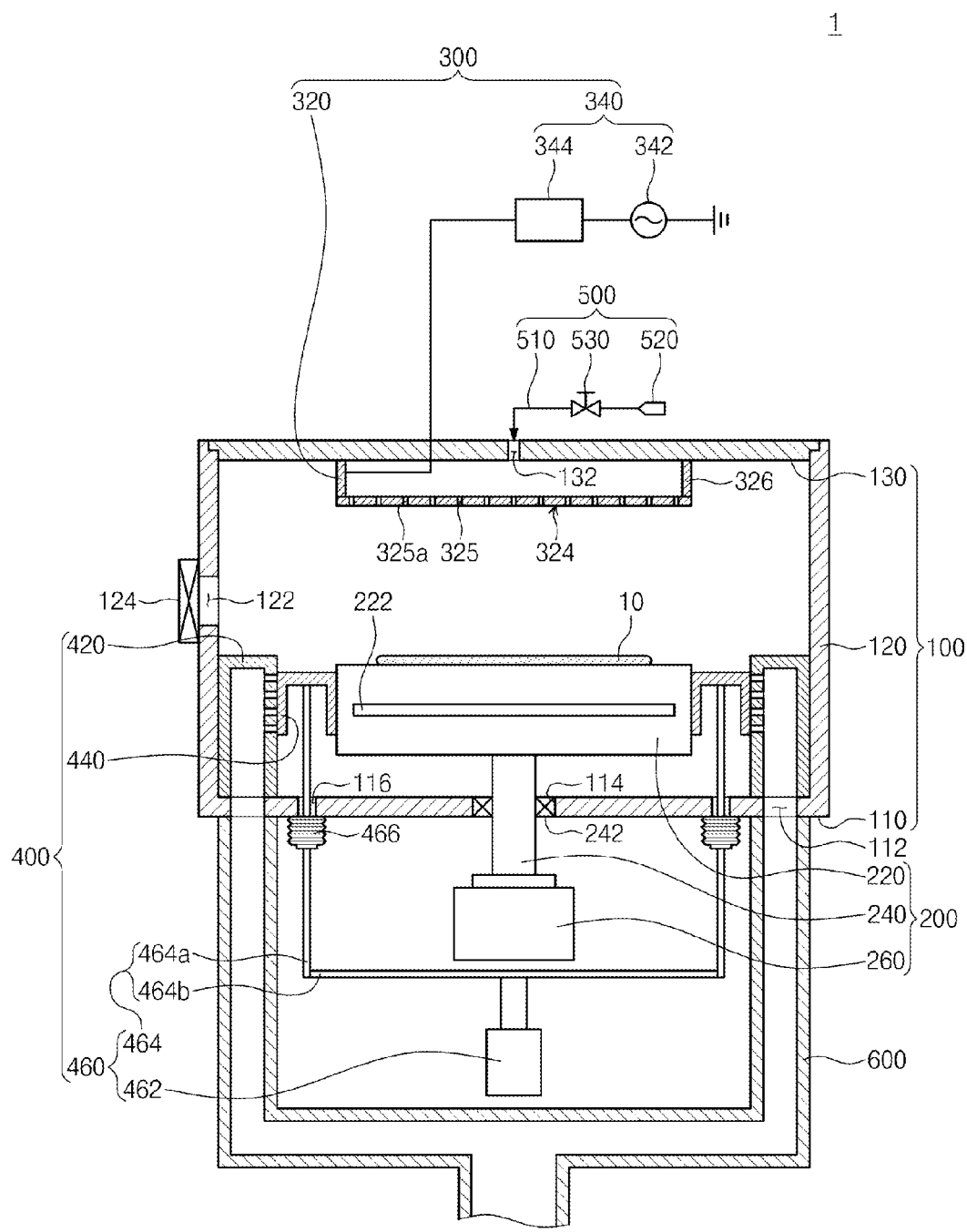
FIG. 2 is a cross-sectional view of a substrate treating apparatus according to an embodiment of the present invention.

FIG. 2 is a cross-sectional view of the substrate treating apparatus 1 according to an embodiment of the present invention. Referring to FIG. 2, the substrate treating apparatus 1 includes a processing chamber 100, a substrate supporting unit 200, a plasma generation unit 300, an exhaust adjusting unit 400, a gas supplying unit 500, and an exhaust line 600.

The processing chamber 100 provides a space for performing a plasma treating process on the substrate 10. The substrate supporting unit 200 is disposed in the processing chamber 100, and supports the substrate 10 which will be subjected to plasma treatment. The plasma generation unit 300 is provided above the substrate supporting unit 200, and ionizes a plasma source gas supplied from the gas supplying unit 500 to generate plasma. The exhaust adjusting unit 400 adjusts a discharge amount of reaction by-products generated in the processing chamber 100 while the process is performed. The exhaust line 600 discharges reaction by-products generated in the processing chamber 100 to the outside of the processing chamber 100 while the process is performed.

The processing chamber 100 provides a space for performing a plasma treating process. The processing chamber 100 includes a bottom wall 110, a side wall 120, and an upper wall 130. The bottom wall 110 may have a disc shape. The side wall 120 extends upward along an edge circumference of the bottom wall 110. The upper wall 130 is disposed on an upper end of the side wall 120 to seal a space defined by the bottom wall 110 and the side wall 120.

A gas inlet hole 132 through which a plasma source gas is introduced is defined in the upper wall 130. The gas supplying unit 500 is connected to the gas inlet hole 132.

Openings 112 through which reaction by-products in the processing chamber 100 are discharged are defined in an edge area of the bottom wall 110, and the exhaust line 600 is connected to the openings 112. A vacuum pump (not shown) is installed on the exhaust line 600. The vacuum pump (not shown) adjusts an internal pressure of the processing chamber 100 to a process pressure. Residual gas and reaction by-products in the processing chamber 100 are discharged to the outside of the processing chamber 100 through the exhaust line 600. A hole 114 through which a driving shaft 240 of the substrate supporting unit 200 is insertedly installed is defined in a central area of the bottom wall 110. An opening 122 through which a substrate is loaded and unloaded is defined in the side wall 120, and the opening 122 is opened and closed by a door member 124 such as a gate valve.

The substrate supporting unit 200 supports the substrate 10 which will be subjected to plasma treatment and allows the substrate 10 to rotate or vertically move. The substrate supporting unit 200 includes a spin chuck 220, a driving shaft 240, and a driver 260. The spin chuck 220 is disposed in the processing chamber 100. The spin chuck 220 may be an electro static chuck (ESC) adsorbing and supporting the substrate by an electrostatic force. Also, the spin chuck 220 may be a mechanical clamping chuck or a vacuum chuck adsorbing and supporting the substrate by a vacuum pressure. A heater 222 for heating the substrate to a process temperature may be provided on the spin chuck 220. A high-frequency power supply (not shown) may be connected to the spin chuck 220 to supply a bias voltage.

The driving shaft 240 passes through the hole 114 defined in the bottom wall 110 of the processing chamber 100 to be insertedly installed. Specifically, a bearing member 242 is inserted into the hole 114 of the bottom wall 110, and the driving shaft 240 is insertedly fixed to an inner ring of the bearing member 242 to be rotatably supported. The driving shaft 240 has an upper end coupled to a bottom surface of the spin chuck 220, and a lower end connected to the driver 260 disposed under the processing chamber 100. The driving shaft 240 transfers a driving force generated by the driver 260 to the spin chuck 220. The driver 260 may provide a rotational driving force for allowing the spin chuck 220 to rotate, and may also provide a linear driving force for allowing the spin chuck 220 to vertically move.

The plasma generation unit 300 is provided above the spin chuck 220, and ionizes a plasma source gas supplied from the gas supplying unit 500 to generate plasma. The plasma generation unit 300 includes an electrode 320 and a power supplying unit 340. According to an embodiment, the plasma generation unit 300 may be a capacitively coupled plasma source (CCP).

The electrode 320 is installed on a lower end of a central area of the upper wall 130 of the processing chamber 100 to generate plasma by capacitive coupling. The power supplying unit 340 applies a high-frequency current to the electrode 320.

The electrode 320 includes an injection plate 324 and a side plate 326.

The injection plate 324 may have a disc shape and be disposed to be spaced under the upper wall 130 to face the substrate. A plurality of injection holes 325 are formed in the injection plate 324. Plasma is generated inside the injection holes 325 by a hollow cathode effect.

The side plate 326 has a ring shape. The side wall 326 has a lower end connected to a circumference of the injection plate 324 and extends upward to be connected to a lower end of the upper wall 130.

An insulation layer 325a may be provided on an inner surface of the injection holes 325. The insulation layer 325a may be made of a highly dielectric material such as ceramic and formed in a way of coating or adhesion.

The power supplying unit 340 applies a high-frequency current to the electrode 320. The power supplying unit 340 includes a high-frequency power supply 342 and a matcher 344. The high-frequency power supply 342, the matcher 344, and the electrode 320 are connected in sequence by an electric line. A high-frequency current applied from the high-frequency power supply 342 is applied to the electrode 320 through the electric line.

The exhaust adjusting unit 400 adjusts a discharge amount of residual gas and by-products in the processing chamber 100. The exhaust adjusting unit 400 includes an exhaust container 420, an adjusting member 440, and a driving unit 460.

Figure 3:
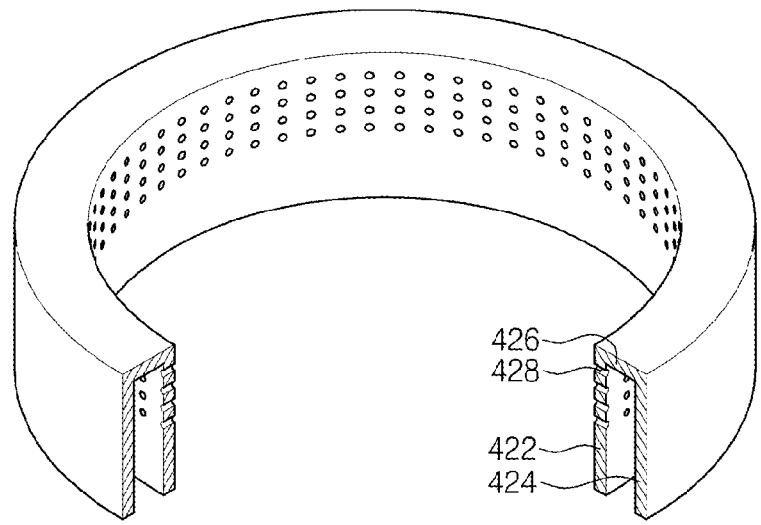
FIG. 3 is a cut-away perspective view illustrating a portion of an exhaust container the in FIG. 2.

The exhaust container 420 is provided on a lower end of the processing chamber 100 along an inner surface of the side wall 120. For example, the exhaust container 420 may be disposed above the opening 112 of the bottom wall 110. FIG. 3 is a perspective view illustrating an embodiment of the exhaust container 420. Referring to FIG. 3, the exhaust container 420 has an annular ring shape with an opened bottom end. The exhaust container 420 has an inner surface 422 facing the substrate supporting unit 200, an outer surface 424 facing an inner wall of the side wall 120, and a top surface 426 connected to upper ends of the inner surface 422 and the outer surface 424. An exhaust hole 428 is defined in the exhaust container 420.

Figure 4:
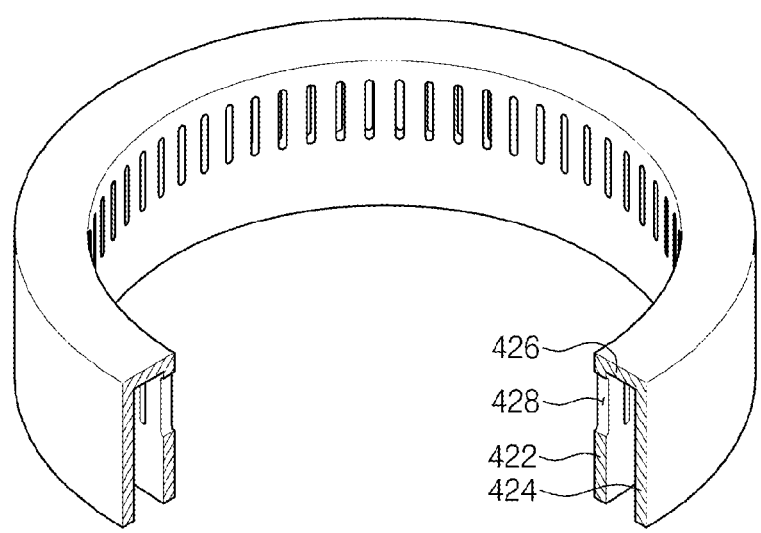
FIG. 4 is a cut-away perspective view illustrating a portion of the exhaust container in which a slit is provided as an exhaust hole.

The exhaust hole 428 may be provided with inner side holes defined in the inner surface 422. The exhaust holes 428 may be arranged to form a plurality of rows and columns. Each of the rows formed by the exhaust holes 428 may have a ring shape surrounding the substrate supporting unit 200. The rows of the exhaust hole 428 are provided in plurality and a height of the each row is different. The exhaust holes 428 may be vertically arranged from each other. Residual gas and reaction by-products in the chamber 100 are discharged to the exhaust line 600 through the exhaust hole 428. Alternatively, as illustrated in FIG. 4, each of the exhaust holes 428 may be provided as a slit of which length direction is vertically provided, and the slit may be arranged in a ring shape surrounding the substrate supporting unit.

Figure 5:
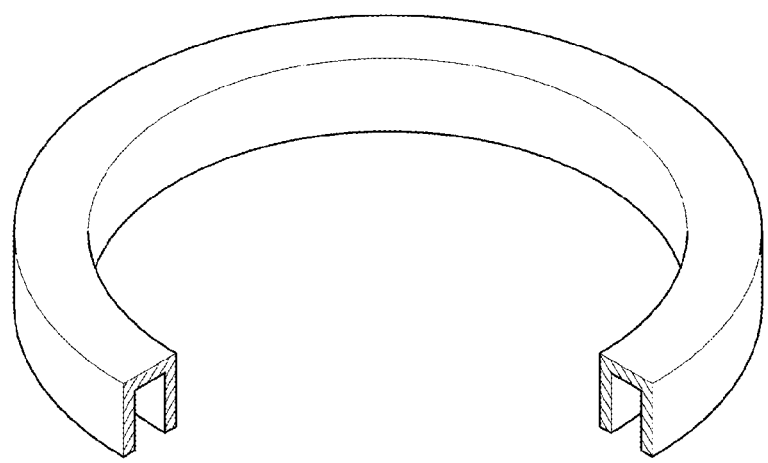
FIG. 5 is a cut-away perspective view illustrating a portion of an adjusting member in the FIG. 2.

FIG. 5 is a perspective view illustrating an embodiment of the adjusting member 440. Referring to FIG. 5, the adjusting member 440 has an annular ring shape. The adjusting member 440 may be provided with a hollow shape having an opened bottom end. Here, energy efficiency during vertical movement may be increased by reducing a weight of the adjusting member 440. Referring to FIG. 2 again, the adjusting member 440 is disposed between the substrate supporting unit 200 and the exhaust container 420. The adjusting member 440 has a side surface adjacent to a side surface of the supporting plate 220 and an inner surface 422 of the exhaust container 420. The adjusting member 440 vertically moves to adjust an opening/closing rate of the exhaust holes 428. Accordingly, when the adjusting member 440 is disposed at a first position, the exhaust hole 428 is completely closed, and when the adjusting member 440 is disposed at a second position, the exhaust hole 428 is completely opened. Also, when the adjusting member 440 is disposed at a position between the first position and the second position, the exhaust hole 428 is partially opened. The first position is higher than the second position. The adjusting member 440 may move from the first position to the second position. Discharge amounts of residual gas and reaction by-products are adjusted by the opening/closing rate of the exhaust holes 428. Accordingly, a uniformity of a substrate treating process may be controlled by changing a position of the adjusting member 440 to adjust a residence time or pressure of gas, plasma, or the like in the processing chamber 100.

The driving unit 460 includes a driver 462 and a connection member 464. The driving unit 460 allows the adjusting member 440 to linearly move in a vertical direction. An opening 116 is defined in the bottom wall 110 of the processing chamber 100. The opening 116 is provided around the substrate supporting unit 200. The opening 116 is provided between the substrate supporting unit 200 and the exhaust container 420. The opening 116 may be provided singly or provided in plurality. The driving unit 460 passes through the opening 116.

The driver 462 generates a driving force for allowing the adjusting member 440 to linearly move in a vertical direction. The driver 462 is provided in a lower portion of the connection member 464.

The connection member 464 may include a rod of which a length direction is vertically provided, and a rod of which a length direction is horizontally provided. Hereinafter, the rod of which the length direction is vertically provided is called a first rod 464a, and the rod of which the length direction is horizontally provided is called a second rod 464b. Each of the first rod 464a and the second rod 464b may be provided singly or provided in plurality. The first rods 464a pass through the openings 116, and have upper ends coupled to the adjusting members and lower ends coupled to the second rods 464b. The first rods 464a are provided as many as the openings 116. The connection member 464 transfers a driving force generated from the driver 462 to the adjusting member 440. The connection member 464 may be provided in various shapes in addition to the above-described shape. A sealing member 466 for sealing from the outside may be provided under the opening 116. The sealing member 466 may have a bellows shape to surround the first rod 464a.

Referring to FIG. 2 again, the gas supplying unit 500 supplies a plasma source gas to a gas inlet hole 132 defined in the upper wall 130 of the processing chamber 100. The gas supplying unit 500 includes a gas supplying line 510, a gas supplying source 520, and a valve 530. The gas supplying line 510 has one end coupled to the gas inlet hole 130 and the other end coupled to the gas supplying source 520. The valve 530 for adjusting a flow rate and opening/closing a flow of a plasma source gas is installed on the gas supplying line 510 between the gas inlet hole 132 and the gas supplying source 520.

FIGS. 6 through 9 are views for describing other embodiments of the substrate treating apparatus of the present invention.

Figure 6:
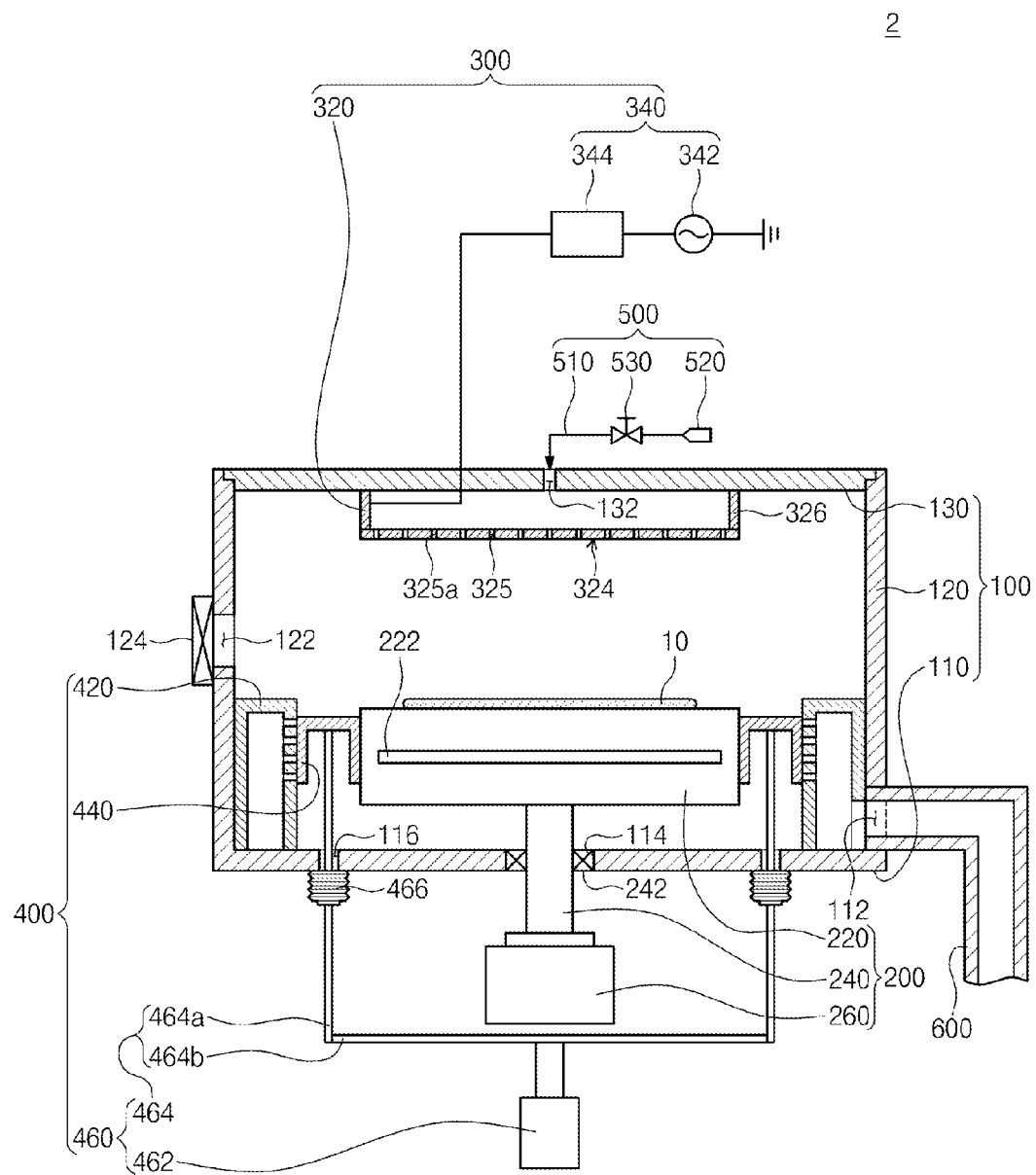
FIG. 6 is a cross-sectional view illustrating a substrate treating apparatus in which an exhaust line is provided on a side of a chamber.

FIG. 6 is a cross-sectional view of a substrate processing apparatus 2 according to another embodiment of the present invention. Referring to FIG. 6, the substrate treating apparatus 2 is substantially similar to the substrate treating apparatus 1 except the form in which an exhaust line 600 is connected to a processing chamber 100. An opening 112 may be defined in a lower portion of a side wall 120 of the processing chamber 100. The exhaust line 600 is connected to the opening 112. Here, an opening 420a is defined in a side surface of an exhaust container 420 to communicate between an inside of the exhaust container 420 and the exhaust line 600.

Figure 7:
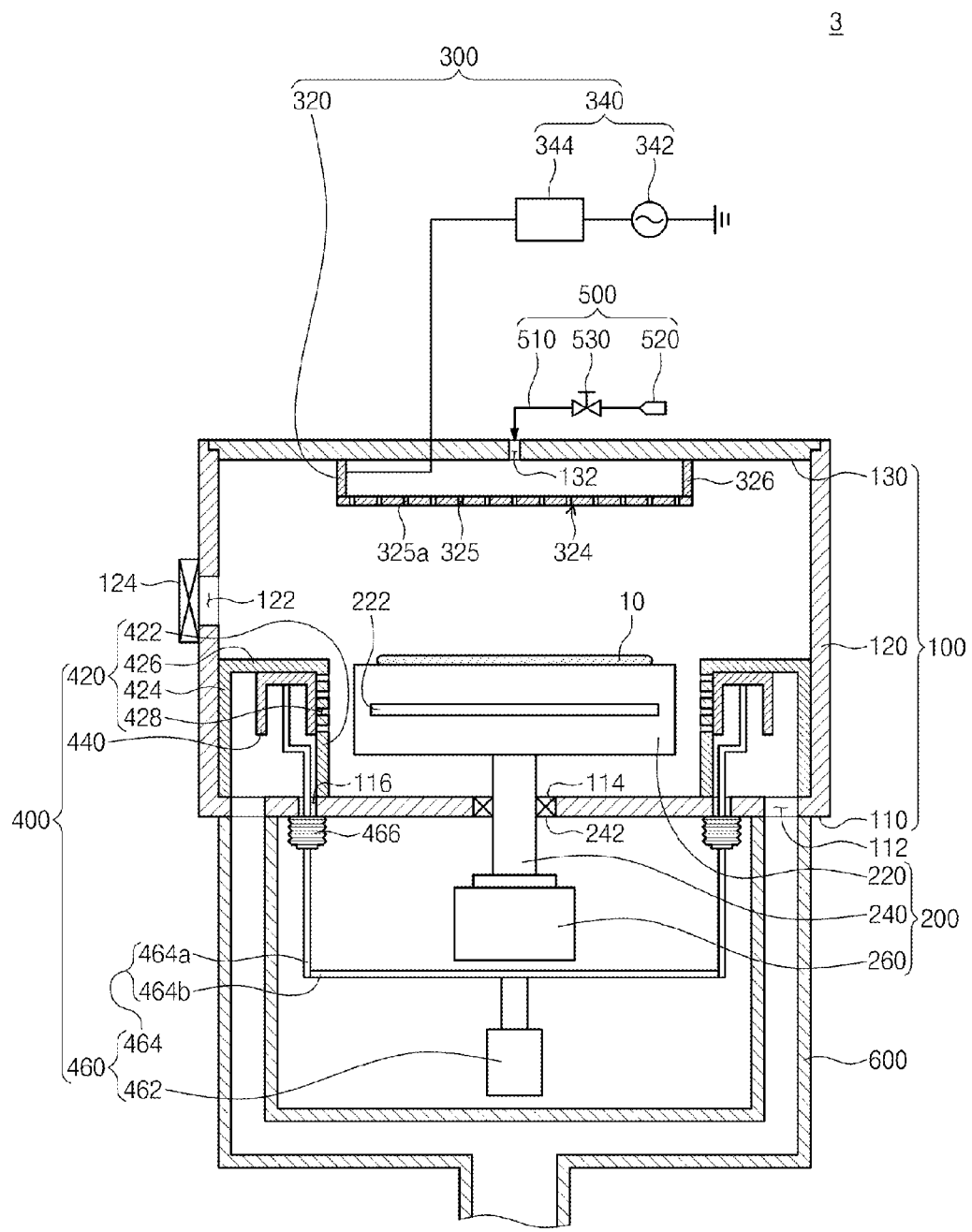
FIG. 7 is a cross-sectional view of a substrate treating apparatus according to another embodiment of the present invention.

FIG. 7 is a cross-sectional view of a substrate treating apparatus 3 according to another embodiment of the present invention. Referring to FIG. 7, the substrate treating apparatus 3 may have the components with same configurations, structures, and functions, as those of the substrate treating apparatus 1 except an exhaust adjusting unit 400. Components of the exhaust adjusting unit 400 are same as those of the above-described embodiments. The only different feature is that an adjusting member 440 is provided in the exhaust container 420 in this embodiment. A side surface of the adjusting member 440 is adjacent to an inner surface 422 of the exhaust container 420. Referring to the cross-section illustrated in FIG. 7, the adjusting member 440 has a top surface which is shorter in length than a top surface 426 of the exhaust container 420. Residual gas and reaction by-products are discharged to an exhaust line 600 through a space between the adjusting member 440 and an outer surface 424 of the exhaust container 420. An opening 116 faces an inside of the exhaust container 420.

Figure 8:
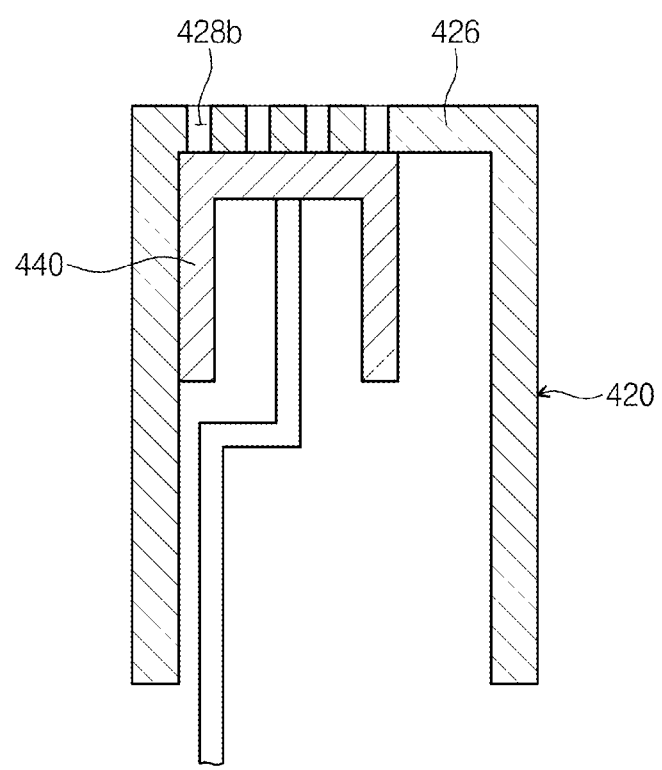
FIG. 8 is a cross-sectional view illustrating an exhaust hole in FIG. 7, which includes upper side holes.

FIG. 8 is a cross-sectional view illustrating the exhaust hole 428 in FIG. 7, which includes upper side holes 428b. Referring to FIG. 8, the exhaust hole 428 may include the upper side holes 428b defined in the top surface 426 of the exhaust container 420. Here, residual gas and reaction by-products are discharged to the exhaust line 600 through the upper side holes 428b.

Figure 9:
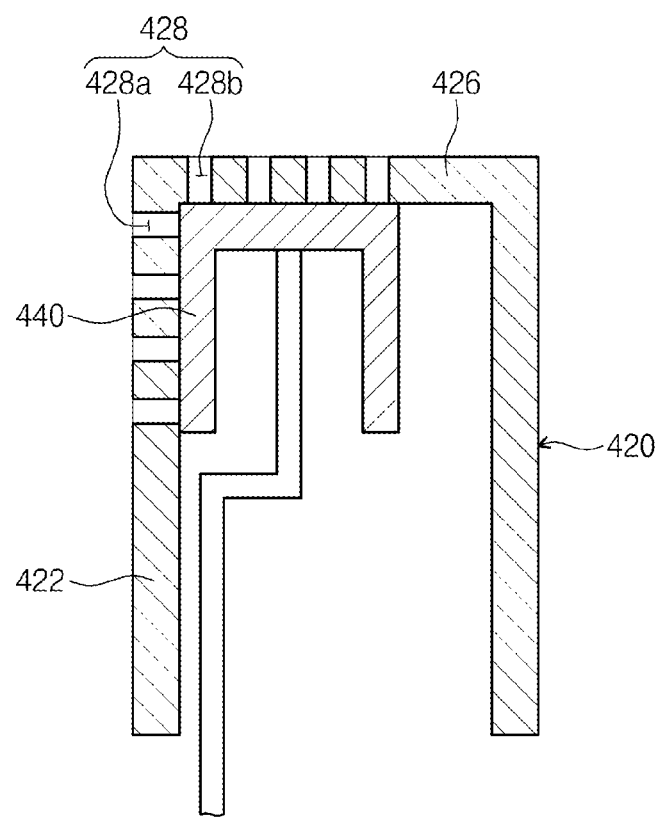
FIG. 9 is a cross-sectional view illustrating the exhaust hole in FIG. 7, which includes upper side holes and inner side holes.

FIG. 9 is a cross-sectional view illustrating the exhaust hole in FIG. 7, which includes inner side holes 428a and the upper side holes 428b. Referring to FIG. 9, the exhaust hole 428 may include the inner side holes 428a defined in the inner surface 422 of the exhaust container 420 and the upper side holes 428b defined in the top surface 426 of the exhaust container 420. Here, residual gas and reaction by-products are discharged to the exhaust line 600 through the inner side holes 428a and the upper side holes 428b.

When the exhaust hole 428 of the substrate treating apparatus 3 includes inner side holes 428a, a method of adjusting discharge amounts of residual gas and reaction by-products is same as that described for the substrate treating apparatus 1 in FIG. 2.

When the exhaust hole 428 of the substrate treating apparatus 3 includes the upper side holes 428b, the upper side holes 428b are provided within a range facing a top surface of the adjusting member 440. Accordingly, when the top surface of the adjusting member 440 is disposed adjacent to a lower end of the top surface 426 of the exhaust container, the upper side holes 428b are completely closed. By adjusting a vertical position of the adjusting member 440, a distance between the top surface of the adjusting member 440 and the top surface 426 of the exhaust container is adjusted. Therefore, as the adjusting member 440 vertically moves, discharge amounts of residual gas and reaction by-products may be adjusted.

The above-described embodiment is explained by using the substrate treating apparatus using a CCP source method. However, embodiments of the present invention may apply to the substrate treating apparatus using an inductively coupled plasma (ICP) source method or a remote plasma method.

A substrate treating apparatus and a substrate treating method according to an embodiment of the present invention vertically transfer an adjusting member to adjust an opening/closing rate of exhaust holes, thereby directly adjusting discharge amounts of residual gas and reaction by-products, so that the uniformity of a substrate treating process can be controlled by controlling a residence time of plasma and gas flow in a chamber.

The above detailed description exemplifies embodiments of the present invention. Further, the above contents just illustrate and describe preferred embodiments of the present invention and an embodiment of the present invention can be used under various combinations, changes, and environments. That is, it will be appreciated by those skilled in the art that substitutions, modifications and changes may be made in these embodiments without departing from the principles and spirit of the general inventive concept, the scope of which is defined in the appended claims and their equivalents. The above-mentioned embodiments are used to describe a best mode in implementing the inventive concept. An embodiment of the present invention can be implemented in a mode other than a mode known to the art by using another invention and various modifications required a detailed application field and usage of the present invention can be made. Therefore, the detailed description of embodiments of the present invention does not intend to limit the present invention to the disclosed embodiments. Further, the appended claims should be appreciated as a step including even another embodiment.

What is claimed is:

1. A substrate treating apparatus, comprising:
    a processing chamber having an inner space for treating a substrate and having an opening through which residual gas and reaction by-products are discharged,
    a substrate supporting unit disposed in the processing chamber to support the substrate,
    a plasma generation unit generating plasma supplied to the substrate; and
    an exhaust adjusting unit adjusting discharge amounts of residual gas and reaction by products in the chamber, wherein the exhaust adjusting unit comprises:
        an exhaust container surrounding a side surface of the substrate supporting unit, and having an exhaust hole which is defined by the surface of the exhaust container, wherein the exhaust hole comprises:
            inner side holes provided on an inner surface of a vertical side of the exhaust container, the inner side holes extending through the vertical side of the exhaust container,
        an adjusting member adjusting an opening/closing rate of the exhaust hole and is provided between the substrate supporting unit and the exhaust container; and
        a driving unit allowing the adjusting member to vertically move.

2. The substrate treating apparatus of claim 1, wherein the exhaust container has a ring shape.

3. The substrate treating apparatus of claim 1, wherein the exhaust hole is provided as a slit of which a length direction is vertically provided.

4. The substrate treating apparatus of claim 1, wherein some of the exhaust holes are vertically arranged.

5. The substrate treating apparatus of claim 4, wherein some of the exhaust holes are arranged in a ring shape surrounding the substrate supporting unit.

6. The substrate treating apparatus of claim 1, wherein the exhaust hole comprises inner side holes provided in an inner surface of the exhaust container, and the adjusting member is provided in the exhaust container.

7. The substrate treating apparatus of claim 6, wherein the exhaust hole further comprises upper side holes provided in a top surface of the exhaust container.

8. The substrate treating apparatus of claim 1, wherein the exhaust hole further comprises upper side holes provided on a top surface of the exhaust container, and the adjusting member is provided in the exhaust container.

9. The substrate treating apparatus of claim 1, wherein the apparatus further comprises a gas supplying unit supplying the gas to the plasma generation unit.

10. The substrate treating apparatus of claim 1, wherein the exhaust hole is provided singly or in plurality.

11. The substrate treating apparatus of claim 10, wherein the exhaust hole is provided around the substrate supporting unit.

12. The substrate treating apparatus of claim 11, wherein the exhaust hole includes upper side holes defined in the top surface of the exhaust container.

* * * * *